United States Patent [19]

Truhe, Jr.

[11] Patent Number: 4,852,176
[45] Date of Patent: Jul. 25, 1989

[54] CONTINUOUS DIFFERENTIAL SIGNAL EQUALIZER

[76] Inventor: Joseph V. Truhe, Jr., 11720 Grandview Ave., Wheaton, Md. 20902

[21] Appl. No.: 862,324

[22] Filed: May 12, 1986

[51] Int. Cl.[4] .............................................. H03G 5/00
[52] U.S. Cl. ...................................... 381/103; 381/59
[58] Field of Search .................... 381/103, 98, 106, 96, 381/59

[56] References Cited

U.S. PATENT DOCUMENTS

| | | | |
|---|---|---|---|
| 3,798,374 | 3/1974 | Meyers | 381/96 |
| 4,130,727 | 12/1978 | Kates | 381/106 |
| 4,316,060 | 2/1982 | Adams et al. | 381/98 |
| 4,340,780 | 7/1982 | Odlen | 381/103 |
| 4,421,949 | 12/1983 | Eberbach | 381/98 |
| 4,458,362 | 7/1984 | Berkovitz et al. | 381/103 |
| 4,549,289 | 10/1985 | Schwartz | 381/71 |
| 4,628,530 | 12/1986 | Op de Beek | 381/103 |

FOREIGN PATENT DOCUMENTS 3343027 6/1985 Fed. Rep. of Germany ........ 381/98

OTHER PUBLICATIONS

Audio Cyclopedia, 1979, pp. 1112 and 1115.

Primary Examiner—Forester W. Isen

[57] ABSTRACT

A method of processing an audio signal to provide automatic continuous correction for the variable efficiency of the loudspeaker system under varying amplitude and frequency conditions. The signal is continuously sampled for frequency and amplitude components over time. A microprocessor is programed to compensate for the actual performance of the specific loudspeaker system chosen under the signal conditions encountered. Two embodiments, one operating in the frequency domain, and the other operating in the time domain, are disclosed.

7 Claims, 2 Drawing Sheets

CONTINUOUS DIFFERENTIAL SIGNAL EQUALIZER

BACKGROUND

The invention relates to the processing or equalization of audio signals to compensate for deficiencies in the performance of the loudspeaker system. The previously recognized goal of "flat" response to a swept sine wave over the audible frequency range is approached in the prior art in two principal ways. Loudspeaker manufacturers employ elaborate crossover network circuitry to divide the signal among drivers whose design and composition are suited to relatively uniform performance with a frequency range. "Graphic" equalizers are introduced into the reproduction system to correct the signal for the variable influence of the listening room in different frequency ranges and to further compensate for speaker deficiencies, again with the goal of uniform response to a signal of a given amplitude whose frequency is varied. Lacking however has been a recognition that true rendition of a complex signal requires not only uniform frequency response at any given amplitude, but also uniform efficiency at different amplitudes of the same or other frequencies, and the maintenance of that uniformity as the delivery of one signal component of a given frequency and amplitude affects the efficiency of the driver in the simultaneous delivery of other amplitude and frequency components of a complex audio signal. FIG. 1 shows a hypothetical set of reponse curves at various amplitudes within the range of a single driver. Any one of the curves would be considered acceptably "flat" for commercial purposes within the prior art. However, unless the efficiency of the driver at points (A) and (B) is identical, undesirable coloration of the signal will result. If a musical instrument produces a primary tone of 1000 HZ at power level $w_1$ after amplification, (A), and a harmonic overtone of 10 KHZ at $w_5$, also after amplification, (B), faithful rendition of the tonal quality of the instrument is not assured by the flatness of the response curves at $w_1$ and $w_5$, but only by the equivalence of the response at the frequency and amplitude conditions (A) and (B). Moreover, such equivalence must be maintained as the driver attempts to render the separate signal components simultaneously. The efficiency of delivery of a weak higher frequency signal component will vary as lower frequency components are added and as their amplitudes are increased. Conventional equalizers, whose parameters are fixed by testing frequencies in isolation or with "white" noise, and only as affected by room conditions, cannot compensate for either of the above variations in speaker efficiency. Conventional equalizers fail because they bias a given frequency range by a fixed proportion regardless of the presence of signal components of other amplitudes and frequencies. Biasing in this fashion does not even compensate for room conditions appropriately as disclosed in U.S. Pat. No. 4,458,362, and it is not suitable for correction of speaker efficiency in any case. The invention, in either embodiment, samples the signal continuously, identifies the frequency and amplitude components, and modifies the signal only as appropriate under those conditions. For example, a relatively high frequency sub-range might receive enhancement only when it is below a given amplitude or only when it is rendered in combination with a much greater signal in a nearby frequency sub-range.

SUMMARY OF THE INVENTION

An object of the invention is to provide a method of signal equalization directed to variations in loudspeaker efficiency which modifies the signal only when and in the amount dictated by the instantaneous signal parameters.

In one embodiment, the output from the power amplifier is divided into discrete frequency ranges corresponding to the ranges of the drivers employed using crossover circuitry analogous or identical to that in the loudspeaker itself. Each range is further subdivided into a desired number of sub-ranges. The amplitude of the signal components in each sub-range is determined and converted to digital form, using comparators or analog peak level indicators with digital readout. A microprocessor circuit comprising a CPU and a ROM accepts the digital identification of the amplitude level in each sub-range and then selected a set of appropriate decisions, in binary form, controlling multiple switches connecting the separate sub-range signal paths to one or more parallel resistances selected to correct for variations in speaker efficiency at the frequency and amplitude combinations identified. The device is necessarily dedicated to the particular loudspeaker, with the ROM preset with correction instructions for each permutation of amplitude and frequency tested. The manufacturer will determine corrections by field testing the loudspeaker with test signals corresponding to a sampling matrix, derived to most effectively correspond to the observed variations in efficiency. The resistance levels are then selected which most effectively reduce the variations in efficiency at the frequency and amplitude combination tested. The signal paths are then recombined and delivered to the loudspeaker.

In another embodiment, operating in the time domain, the signal is processed before amplification by again being split according to the frequency ranges of the drivers employed by means of an analogous crossover circuit or corresponding digital device. A microprocessor is employed comprising a shifting memory RAM, a ROM, and a CPU. The successive binary signal codes are stored in the memory RAM, with each arrival displacing the least recent. The CPU reads the stored values simuntaneously and also reads the value of the amplifier gain computed by comparing the output level of the amplifier to that of the input signal, expressing the result in digital form. These values are then transmitted to the ROM, programmed to use the values as the variables in an equation describing the actual performance characteristics of the drivers in operation. The equation will be derived by the manufacturer which reflects the displacement of the driver as a function of the signal amplitude, the driver efficiency, the amplifier gain and the inertial resistance of the driver to a desired change in velocity as a function of the current velocity. The values identified above are sufficient for such an equation, which can then be solved for a corrected signal value which, when delivered to the driver, will yield the desired displacement. The output of the CPU is then a succession of corrected signal values combined with the corrected signals of the remaining frequency ranges and thereafter processed in the same manner as the signal from a digital program source, such as a laser disc.

A further object of the invention, then, is to provide a method of processing an audio signal to compensate for the variability of speaker efficiency under different frequency and amplitude conditions by directly modifying the instantaneous values of the waveform such that the desired displacement of the driver is obtained in practice by substitution of a modified waveform calculated to result in the displacement indicated by the unmodified waveform.

DESCRIPTION OF THE PREFERRED EMBODIMENTS

Figure 1:
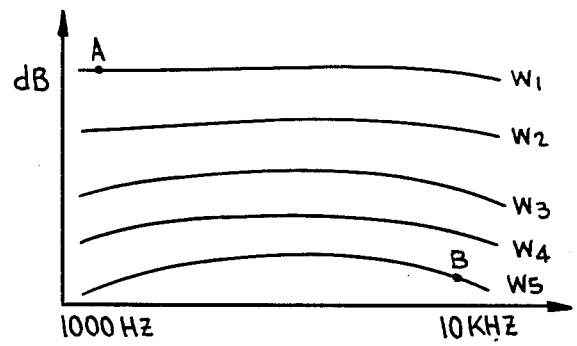
FIG. 1 is an illustration of variable speaker efficiency as a function of amplitude and frequency.
Figure 2:
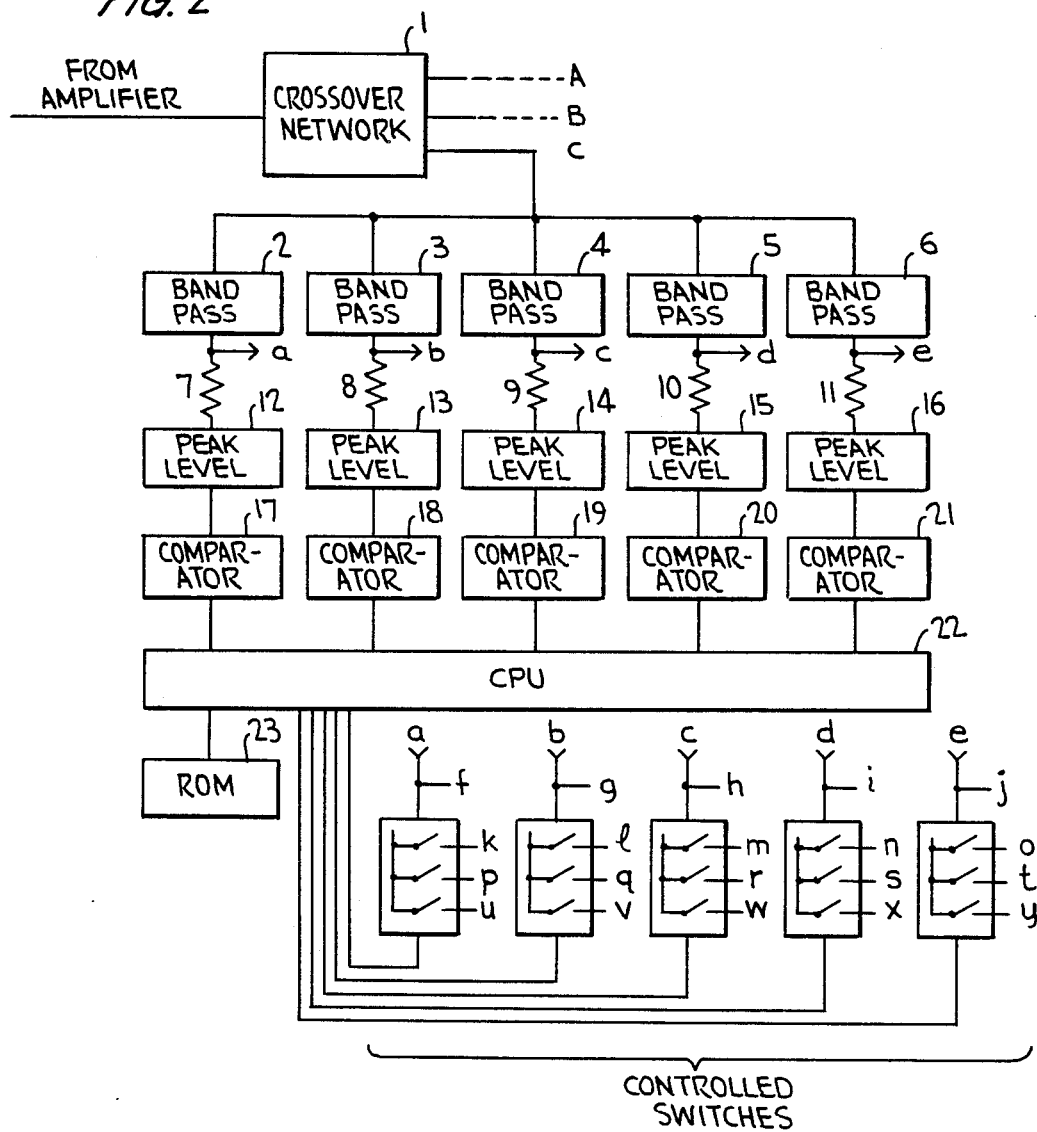
FIG. 2 is a schematic of the circuit components of the first embodiment of the invention.

In FIG. 2, the signal from a power amplifier is divided into a desired number of frequency ranges (for illustration, A–C) by a crossover network 1 designed to divide the signal in the same frequency ranges as the crossover network in the loudspeaker. The separate frequency ranges are processed separately. Each range is further divided through circuits (one shown) employing band pass filters 2–6. The subdivided signals are sampled in parallel through resistance 7–11 and fed to peak level indicators 12–16. The output of the indicators is connected to the input of the comparators 17–21 which convert the amplitude levels into several binary bits. Available peak level indicators employ digital LED readouts of several bits and would eliminate the need for comparators. A microprocessor circuit comprising a CPU 22 and a preprogrammed ROM 23 reads the output of the comparators continuously. The processor consults the ROM, whose memory contains a predetermined binary code for each of the possible binary representations of the permutations of the amplitude in each frequency sub-range. The processor then transmits this binary code to control switches 24–28. The binary bits for any given code from the ROM represent the open-closed switching instructions connecting the separate signal subpaths to one or more parallel resistances 29–32. In the configuration shown, fifteen binary bits provide eight different values for each frequency sub-range. The sub-ranges are recombined and further recombined with the processed signals from the other frequency ranges originating from the crossover 1.

Figure 3:
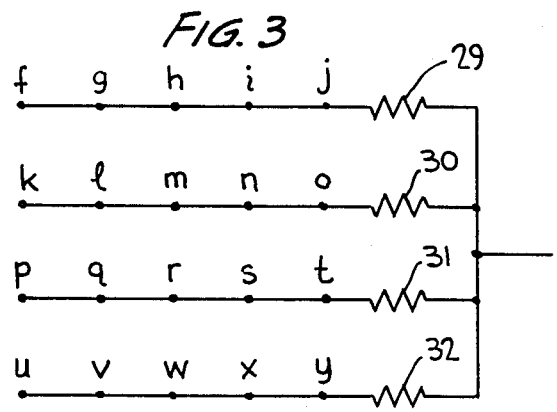
FIG. 3 is a schematic of the switching connections continued from FIG. 2.

It can be seen that as the amplitudes in the frequency sub-ranges vary, the signals in each sub-range will receive varying levels of correction. The manufacturer will test the loudspeaker system under varying frequency and amplitude combinations to determine what portions of the frequency spectrum display the greatest variability of efficiency. The filter values and the comparator levels are selected to distribute a larger portion of the available processing capacity in the areas of greater observed variation in efficiency. Having determined the frequency amplitude matrix to be employed in sampling the signal, the ROM is programmed by testing the loudspeaker under each frequency and amplitude permutation the selected matrix presents. For each such permutation, the efficiency of the speaker in each frequency sub-range is determined by comparing the amplitude of the signal in volts to the output of the speaker in decibels. The deviation of the efficiency in any or all of the sub-ranges from a desired or characteristic target efficiency is measured. The available discrete resistance levels are then selected which most closely approximate the necessary correction to the signal in the frequency sub-range to compensate for the deviation of efficiency from the target efficiency to the greatest extent possible. The switching decisions which represent the identified desired resistance levels for the frequency sub-ranges are then entered in the ROM, which will select those decisions whenever that permutation of amplitudes in the frequency sub-ranges is identified at the input of the CPU. The switching decisions for each permutation are similarly chosen and entered in the ROM. If the degree of variability of efficiency observed dictates, each sub-range can be corrected separately with resistance levels chosen to most efficiently compensate for the distribution of efficiency deviation in that particular frequency sub-range, rather than be corrected in combination with a single array of resistance as shown in FIG. 3.

FIG. 2 is intended as an illustration of the method of the invention and not as limiting the scope thereof. Numerous variations obvious to those skilled in the art present themselves for implementing the teaching of the disclosure. It was noted above that digital level indicators could be substituted for standard analog indicators and comparators. Similarly, the signal samples could be converted directly to digital form and provided as inputs to the processor. The control switches are similarly for illustration as the switching can readily be accomplished with conventional semiconductors controlled by the binary correction codes. Further, conventional equalization circuitry can be incorporated immediately after the controlled switching to provide multiple differential active gain levels controlled by the switching decisions rather than negative resistance levels and additional fixed room equalization as well. The switching codes would continuously select from discreet available gain levels, substituting for the continuous "slide" gain controls of conventional equalizers. Routine circuitry could be incorporated to introduce the appropriate "fixed" equalization for the listening room characteristics at the same time.

Figure 4:
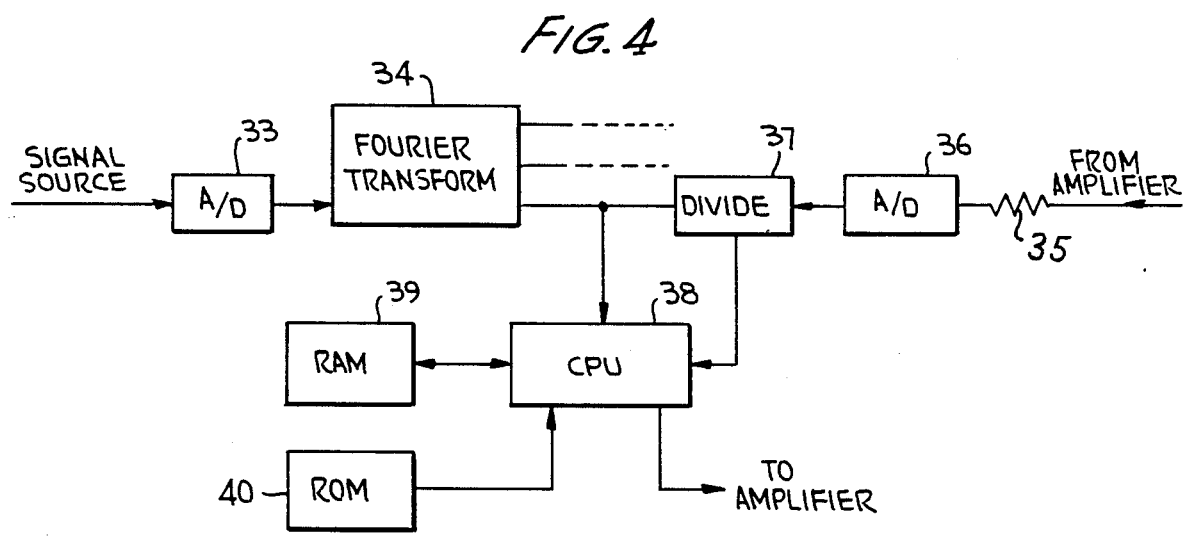
FIG. 4 is a schematic of the circuit components of the second embodiment of the invention.
Figure 5:
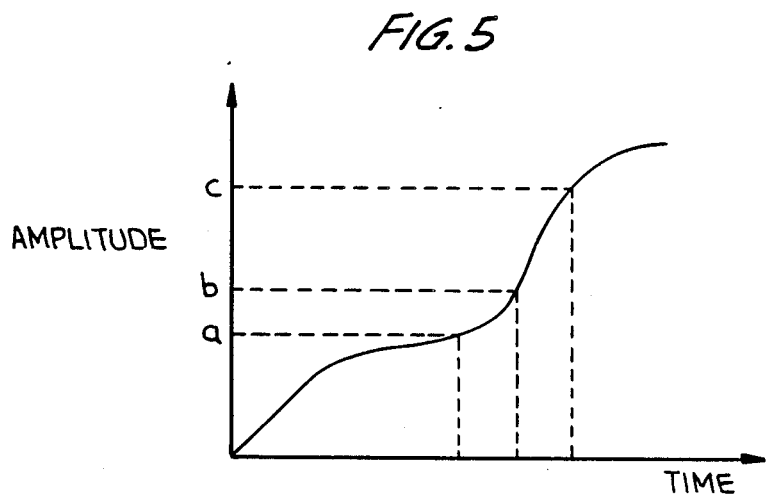
FIG. 5 is a segment of a hypothetical complex waveform of an audio input signal illustrating the derivation of the formula in the second embodiment.

In FIG. 4, a microprocessor circuit is employed to effect the differential correction of the signal by direct digital analysis of the signal from the waveform itself. The waveform represents the sum of the various frequency components in the signal at their respective amplitudes, appearing in a graphic depiction of the waveform as irregular variations in the slope of the wave from point to point. The fundamental mechanical problem confronting loudspeaker design engineers is that the moving element of the driver must have a greater mass the greater the desired potential output sound pressure. Greater compliance with irregular acceleration demands of an audio signal requires lower mass and correspondingly lower inertial resistance to changes in velocity. Increased power and reduced efficiency accomplish a partial trade-off, but inertial effects cannot be eliminated. The circuit in FIG. 3 compensates for these inertial effects in advance, producing a signal which, when delivered to the loudspeaker system, will yield the desired differential displacement of the driver as a result of the operation of the predicted inertial influences. The method requires the deriviation of an operational form of the transfer functions of the individual drivers employed in the loudspeaker system. FIG. 5 will be used for reference to illustrate the deriviation and operation of the transfer function in the invention. The function can be represented analytically as:

$$X_c = (k_1 - k_2 g)gc - g[(k_3 + k_4 g) + (k_5 + k_6 g)(b-a)] \; [(c-b) - (b-a)].$$

$X_c$ is the displacement of the driver at applied voltage c and $(k_1-k_2g)gc$ represents the applied voltage c, the amplifier gain g and the efficiency of the driver, as it is affected by some function, $k_2$ of the gain, measuring the loss of efficiency at extremes of power through coil resistance and heat. The remainder of the equation represents inertial error in the delivery of the desired displacement. $[(c-b)-(b-a)]$ can be treated as the change in slope required in the wave to reach point c. The degree of inertial resistance to change in velocity (slope), $k_3$, will vary as some function, $k_4$ of the gain, thus $(k_3+k_4g)$. The degree of resistance to change in velocity will itself also vary as some function, $k_5$, of the existing velocity (b-a), $k_5$ being dependent by some function, $k_6$, of the gain, hence, the addition of $(k_5+k_6g)$ (b-a). $X_c$ can be measured digitally employing the sort of device disclosed in U.S. Pat. No. 3,798,374. It can be seen that the desired displacement at voltage c is $k_1gc$ and if the loudspeaker displacement were represented in operation by the equation $X_c = k_1gc$, its compliance with any waveform would be perfect. Substituting $k_1gc$ for $X_c$ and c' for the first appearance of c, the equation $k_1gc = (k_1-k_2g)gc' - g[k_3+k_4g) + (k_5+k_6g)$ (b-a)] $[(c-b)-(b-a)]$ can be solved for c' yielding an equation which will calculate a value c' from constants $k_1-k_6$ and variables a, b, c, and g, such that when delivered to the driver after amplification, the desired displacement $k_1gc$ will result. It is anticipated that the loudspeaker manufacturer will observe the driver to be employed in operation using constructed digital test signals and comparing with digital output values determined in the manner disclosed above. The equation above is merely generic, and the nearest ascertainable approximation will suffice to produce a signal corrected to at least some extend for its inertial resistance to compliance. Choices of design and materials for driver construction could be directed towards obtaining more and more mathematically predictable response rather than more intrinsic uniform response, the direction chosen for similar reasons in the Bose patents.

The approximated transfer function is incorporated into the invention as follows. The signal from a program source is converted to digital form with converter 33. The signal from a laser disc or other digital program source could be tapped before the digital to analog conversion. The digital signal is divided by a digital frequency splitting device such as a Fourier transformer 34 programmed to yield the same frequency ranges as the drivers employed in the loudspeaker. Alternatively, the analog signal could be divided with a crossover network and the separate signals converted to digital form. The successive digital values are connected to computing chip 37 which also accepts, through resistance 35 and analog to digital converter 36, the digital value of the signal after amplification, as reduced by the value of the resistor 35. Chip 37 simply divides the value received from the transformer 34 suitably delayed (not shown) and its output, representing the amplifier gain is communicated to central processor 38. The processor receives the successive digital signal values, designated a, b, c for illustration, and directs them to RAM 39, a memory unit programmed to store the most recent three values in succession, shifting the memory registers with each arriving value. The processor is connected to ROM 40 which contains the program to solve for c' from the values a, b, c, and g, now available from the central processor. The value c' is the digital value then recombined with the separately processed signals from the transformer 34 and converted to analog for amplification. As the signal progresses, the values a, b, and c will be replaced with b, c, d and the processor circuit will solve for d', and so on, producing a one-to-one replacement of the digital source signal with an altered signal, which when reproduced by the driver, will produce the displacement values that the unaltered signal would have produced from an ideal driver of constant efficiency and zero mass. The computation time of the processor circuit is irrelevant as long as it is relatively uniform because the products, a', b', c' ... will maintain the same time relations as a, b, c, ... permitting conversion to analog form as readily as if unaltered. Any modification of the program source signal from even a gross approximation of the transfer function will yield, in conjunction with conventional equalization, an improvement over the results obtained from conventional equalization alone. This is so because the processor circuit will, just as in the first embodiment of the invention, provide differential equalization of the signal at different times, depending on the signal conditions, reducing the extent of inappropriate equalization that would occur from a fixed setting in any frequency subrange of a conventional equalizer. To whatever extent differential equalization occurs, compensating for inherent loudspeaker characteristics, the conventional equalizer can be adjusted more exclusively to compensation for room characteristics which are not signal dependent in character.

The invention is not intended to be limited to approximations of the transfer function of the speaker as it can be seen that the ROM can be programmed to perform any sort of analysis of the patterns of the digital wave and apply predetermined alterations accommodating the performance of the speaker, such as adding a fixed or percentage value whenever a slope change is excess of a threshhold is observed.

What is claimed is:

1. A method of processing an audio input signal to compensate for the variable efficiency of the drivers of a speaker system comprising:
   a. applying to said drivers of said speaker system a test audio input signal comprising predetermined permutations of at least two discrete amplitude levels within each of at least two discrete frequencies.
   b. determining adjustments to said test audio input signal at said predetermined amplitude and frequency permutations to enable said drivers to accurately reproduce said test audio input signal,
   c. applying said audio input signal to said speaker system,
   d. continuously sampling said audio input signal to recognize predetermined amplitude and frequency permutations corresponding to those used in step a., e. continuously applying the adjustments determined in step b. corresponding to said recognized permutations to said audio input signal, f. applying said adjusted audio input signal to said drivers.

2. A system for the continuous differential equalization of an audio input signal of variable frequency and amplitude, said system comprising in combination:

a. means for generating an audio input signal, b. speaker means having drivers, c. means for separating said audio input signal into plural frequency ranges.

d. means for continuously sampling the amplitude of said audio input signal in each frequency range and categorizing the amplitude in each range as lying within one of plural predetermined amplitude ranges, e. means for determining and storing signal modification instructions for equalizing said audio input signal in said frequency ranges according to various permutations of amplitude within the frequency ranges, f. processing means responsive only to said sampling means output for continuously identifying permutations of amplitude and frequency of said audio signal corresponding to said stored permutations and for continuously selecting the signal modification instructions corresponding to said identified permutations, g. means for applying said signal modification instructions to said audio input signal and applying the resultant signal to said drivers.

3. The system of claim 2 wherein said separating means separates said audio input signal into frequency ranges corresponding to experimentally observed variability in efficiency of each driver as a combined function of the frequency and amplitude components of a test audio signal.

4. The system of claim 2 wherein said signal modification instructions are stored as digital data.

5. The system of claim 2 wherein said means for applying continuously directs the audio signal in each frequency range to one or more signal paths providing discrete degrees of amplitude modification as controlled by said processing means.

6. A system for the continuous processing of an audio input signal comprising in combination:

a. means to sample and store a shifting set of fixed size of successive digital values of an audio input signal, b. means for computing the gain of the power amplifier in a sound reproduction system, c. computing means preprogramed with an experimentally derived mathematical representation of the relationship between the successive digital values of an audio input signal and the corresponding successive displacements of the drivers in a loudspeaker system when said signal is applied and which computing means, in operation, when supplied with a set of digital signal values from the sampling means and the gain from the gain computing means, computes a substitute signal value, which, when applied to said driver, will result in displacement commensurate with the displacement indicated by said audio input signal value, d. means for processing the audio input signal, the output of the gain computing means, and the inputs and outputs of the sampling means to produce successive substitute digital values.

7. A method of processing an audio input signal to correct for observed deficiencies in loudspeaker performance in a sound reproduction system including power amplifying means comprising:

a. determining experimentally the observed variation between the actual displacement of the drivers in a loudspeaker system and the ideal displacement indicated by the values of a test input signal, b. comparing a digital expression of the displacement and a digital expression of the test signal, c. deriving an approximate mathematical representation of the relationship between the digital expression of said test input signal and the digital expression of the driver displacement resulting from the application of said test input signal, d. sampling a shifting set of successive digital values of said audio input signal, e. computing, from the sampled set of digital values, the amplification gain, and the mathematical representation, successive modified signal values which, when applied to the drivers, will produce displacements analogous to said audio signal values, f. substituting the successive modified values for said audio input signal values in said sound reproduction system.

* * * * *